US012588376B2

(12) United States Patent
Markert et al.

(10) Patent No.: US 12,588,376 B2
(45) Date of Patent: Mar. 24, 2026

(54) SUBSTRATE ARRANGEMENT AND MANUFACTURING METHOD FOR A MICRO DISPLAY

(71) Applicant: Infineon Technologies AG, Neubiberg (DE)

(72) Inventors: Matthias Markert, Weinböhla (DE); Cornelius Fuchs, Weinböhla (DE); Jakob Kriz, Weinböhla (DE)

(73) Assignee: Infineon Technologies AG, Neubiberg (DE)

( * ) Notice: Subject to any disclaimer, the term of this patent is extended or adjusted under 35 U.S.C. 154(b) by 559 days.

(21) Appl. No.: 17/938,462

(22) Filed: Oct. 6, 2022

(65) Prior Publication Data

US 2023/0165082 A1 May 25, 2023

(30) Foreign Application Priority Data

Nov. 23, 2021 (EP) ..................................... 21210079

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC ............. H10K 59/131; H10K 59/1201; H10K 59/1315; H01L 2224/0391; H01L 2224/06051; H01L 2224/0613; H01L 24/06
USPC ........................................................ 257/40
See application file for complete search history.

(56) References Cited

U.S. PATENT DOCUMENTS

| 2003/0045088 | A1* | 3/2003 | Imai | .................. | H01L 21/76838 |
| | | | | | 257/E21.582 |
| 2005/0110736 | A1* | 5/2005 | Jinno | ................... | G09G 3/3208 |
| | | | | | 345/92 |
| 2013/0062777 | A1 | 3/2013 | Ogata | | |
| 2015/0060783 | A1* | 3/2015 | Yoon | ................... | H10K 59/131 |
| | | | | | 257/40 |
| 2015/0162385 | A1 | 6/2015 | Dittmar et al. | | |

(Continued)

FOREIGN PATENT DOCUMENTS

KR 20180025471 A 3/2018

*Primary Examiner* — Norman D Richards
*Assistant Examiner* — Laura M Dykes
(74) *Attorney, Agent, or Firm* — Slater Matsil, LLP

(57) ABSTRACT

A substrate arrangement for a micro display including a semiconductor substrate, a back end of line (BEOL) stack on the semiconductor substrate and wherein the BEOL stack comprises structured wiring layers, an insulating material structure (IMS), and a recess in the IMS, wherein the structured wiring layers are stacked and embedded in the insulating material structure, and wherein an upmost structured wiring layer of the structured wiring layers includes contact pads, and wherein the recess extends to a first set of contact pads; and a conductive layer on the surface of the BEOL stack, wherein the conductive layer includes a first portion including a contact pad array and wherein the conductive layer includes a second portion that is arranged on the first set of contact pads of the BEOL stack, and wherein the first portion of the conductive layer is electrically separated from the second portion of the conductive layer.

18 Claims, 12 Drawing Sheets

(56)        References Cited

U.S. PATENT DOCUMENTS

| | | |
|---|---|---|
| 2021/0202809 A1 | 7/2021 | Lin et al. |
| 2021/0408432 A1* | 12/2021 | Wei ........................... G09F 9/30 |

* cited by examiner

300

100a

100b

SUBSTRATE ARRANGEMENT AND MANUFACTURING METHOD FOR A MICRO DISPLAY

This application claims the benefit of European Patent Application No. 21210079, filed on Nov. 23, 2021, which application is hereby incorporated herein by reference.

TECHNICAL FIELD

Embodiments according to the disclosure are related to a substrate arrangement and a manufacturing method for a micro display.

BACKGROUND

Micro displays are small displays, for example smaller than one or two inches, that may be employed in virtual reality (VR) or augmented reality applications, e.g. in data helmets, VR glasses or smartwatches. For a size comparison, FIG. 1 shows an example of a micro display in front of a one euro coin.

Manufacturing of micro devices is challenging, for example with regard to device quality and service life. A problem of conventional micro displays are defects on contacting surfaces that may lead to device failure.

Hence, there is a need for an improved concept for a device and manufacturing method thereof for micro displays that provides a better compromise between device quality, manufacturing costs, complexity and service life.

This is achieved by the subject matter of the independent claims of the present application. Further embodiments according to the disclosure are defined by the subject matter of the dependent claims of the present application.

SUMMARY

Embodiments according to the disclosure comprise a substrate arrangement for a, for example organic light emitting diode (OLED), micro display, wherein the substrate arrangement comprises a semiconductor substrate and a back end of line (BEOL) stack, wherein the BEOL stack is arranged on the semiconductor substrate and wherein the BEOL stack comprises a plurality of structured wiring layers, an insulating material structure (IMS) and a recess in the IMS. Moreover, the plurality of structured wiring layers are stacked and embedded in the insulating material structure (IMS), and an upmost structured wiring layer of the plurality of structured wiring layers comprises a plurality of contact pads. The recess extends to a first set of contact pads of the plurality of contact pads. In addition, the substrate arrangement comprises a conductive layer, having a metallic material, on the surface of the BEOL stack, wherein the conductive layer comprises a first, structured portion comprising a contact pad array, for example for the OLED micro display, and wherein the conductive layer comprises a second portion that is arranged on the first set of contact pads of the BEOL stack. The first portion of the conductive layer is electrically separated from the second portion of the conductive layer. Furthermore, the first set of contact pads of the BEOL stack and the second portion of the conductive layer are configured to form recessed wire-bond pads.

Further embodiments according to the disclosure comprise a manufacturing method for a, for example, organic light emitting diode (OLED), micro display. The method comprises providing a substrate arrangement having a back end of line (BEOL) stack on a semiconductor substrate, wherein the BEOL stack comprises a plurality of structured wiring layers stacked and embedded in an insulating material structure (IMS). Furthermore, an upmost structured wiring layer of the plurality of structured wiring layers comprises a plurality of contact pads. The method further comprises, after providing the substrate arrangement, locally removing portions of the IMS for exposing first contact pads of the plurality of contact pads of the upmost structured wiring layer, and, after locally removing portions of the IMS, depositing a conductive layer having a metallic material, on the surface of the processed BEOL stack and structuring the deposited conductive (metallic) layer, for providing a first, structured portion of the conductive layer comprising a contact pad array and a second portion of the conductive layer that is arranged on the first set of contact pads of the BEOL stack. Moreover, the first portion of the conductive layer is electrically separated from the second portion of the conductive layer and the first set of contact pads of the BEOL stack and the second portion of the conductive layer are configured to form recessed wire-bond pads.

Embodiments according to the disclosure are based on the idea to provide a substrate arrangement for a micro display wherein a first set of contact pads of a BEOL stack of the substrate arrangement and a portion of a conductive layer, deposited on the surface of the BEOL stack, form recessed wire-bond pads. The recess may be a bond pad opening.

The conductive layer has a metallic material and comprises a first, structured portion comprising a contact pad array. The contact pad array may be configured to be coupled electrically to an OLED, or to a plurality of OLEDs, for example pixels of an OLED. In order to provide a good contact, for example with low resistance and long service life, the surface of the contact pad array may be treated accordingly.

In alternative solutions, the conductive layer may not be deposited on the first set of contact pads, for example because of a manufacturing procedure comprising depositing the conductive layer first, and then opening the substrate arrangement, e.g. forming the recess, in order to expose the first set of conductive pads, e.g. for bonding. Such a manufacturing procedure may comprise structuring, e.g. via etching, the conductive layer, for providing a contact pad array, while the first set of contact pads is exposed.

Hence, there is a target conflict between a surface treatment and/or conditioning of the first set of contact pads and the conductive layer or the contact pad array. Lithographic treatment, etching and/or stripping of photomasks, for example for providing the structuring of the conductive layer may damage the first set of contact pads. Vice versa, in order to allow for a sufficient surface quality of the exposed first set of contact pads, a surface treatment of the conductive layer, for example, the contact pad array may not be performed to its full potential, e.g. in such a way that a good, or best possible, surface is provided, in order not to damage the surface of the first set of contact pads too much.

According to embodiments, it was recognized, that a second portion of the conductive layer may be arranged on the first set of contact pads of the BEOL stack. Consequently, the first set of conductive pads may be exposed first, and treated in such a way that a good contacting surface is provided. Afterwards, the conductive layer may be deposited, hence being in contact to the first set of contact pads, for example providing a good electrical coupling, and further shielding the first set of contact pads from further surface treatment or surface processing steps.

In the following a treatment and/or adjustment of the surface of the conductive layer, as well as the structuring of the conductive layer may be performed to its full potential.

Simplified, the depositing of the conductive layer on the BEOL stack, and therefore on the first set of contact pads may allow for a sophisticated surface conditioning of the conductive layer and hence better surface quality, therefore a better electrical contact and consequently, a reduced probability of device failure and therefore an increased service life expectancy. Substrate arrangements according to embodiments of the disclosure may be fabricated with low costs, for example, since neither complex, nor elaborate surface conditioning steps may have to be performed selectively for distinct surfaces of the substrate arrangement.

BRIEF DESCRIPTION OF THE DRAWINGS

The drawings are not necessarily to scale, emphasis instead generally being placed upon illustrating the principles of the disclosure. In the following description, various embodiments of the disclosure are described with reference to the following drawings, in which.

DETAILED DESCRIPTION OF ILLUSTRATIVE EMBODIMENTS

Figure 1:
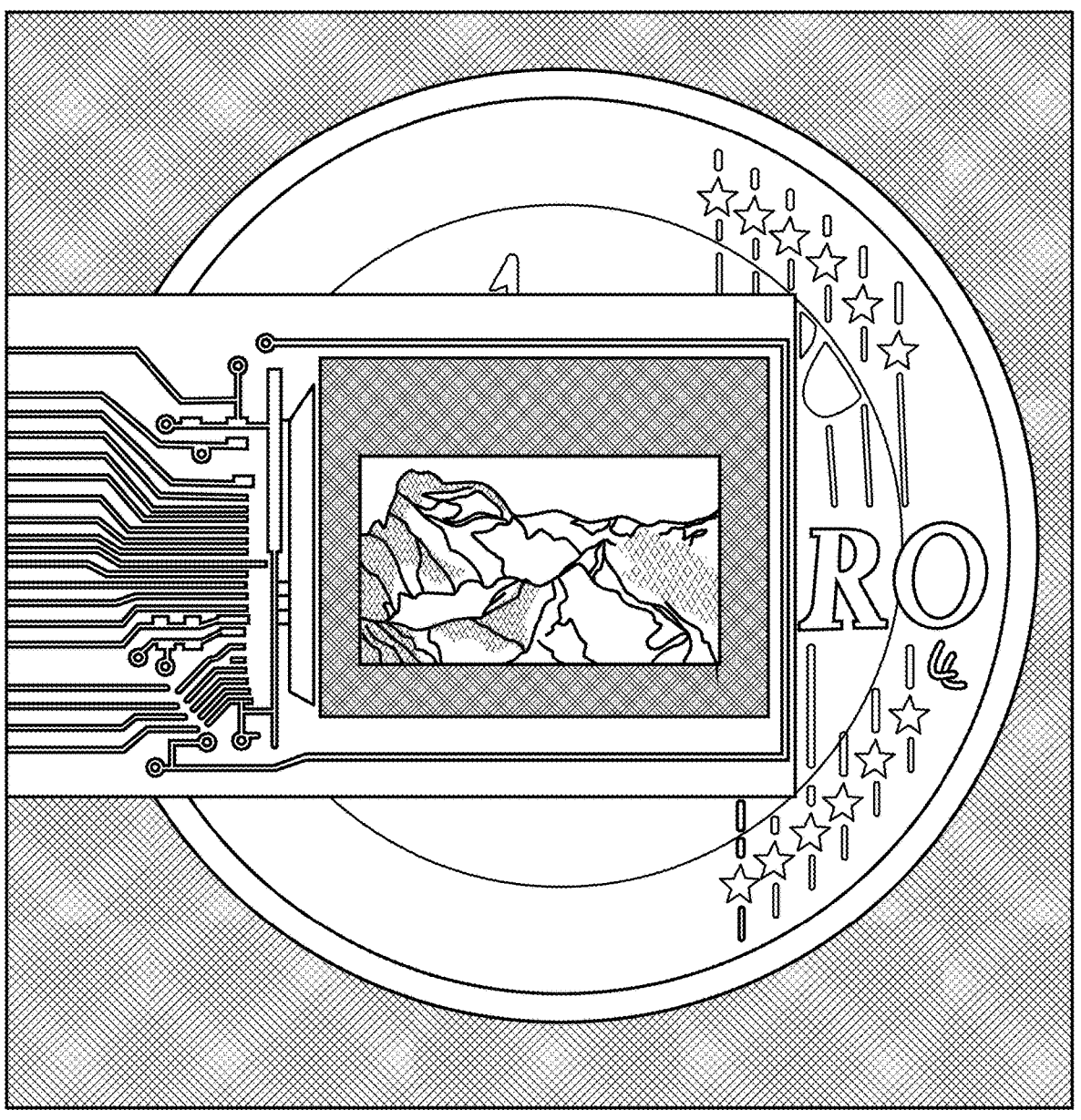
FIG. 1 shows an example of a micro display in in front of a one euro coin.

Equal or equivalent elements or elements with equal or equivalent functionality are denoted in the following description by equal or equivalent reference numerals even if occurring in different figures.

In the following description, a plurality of details is set forth to provide a more throughout explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure.

In addition, features of the different embodiments described herein after may be combined with each other, unless specifically noted otherwise.

Figure 2:
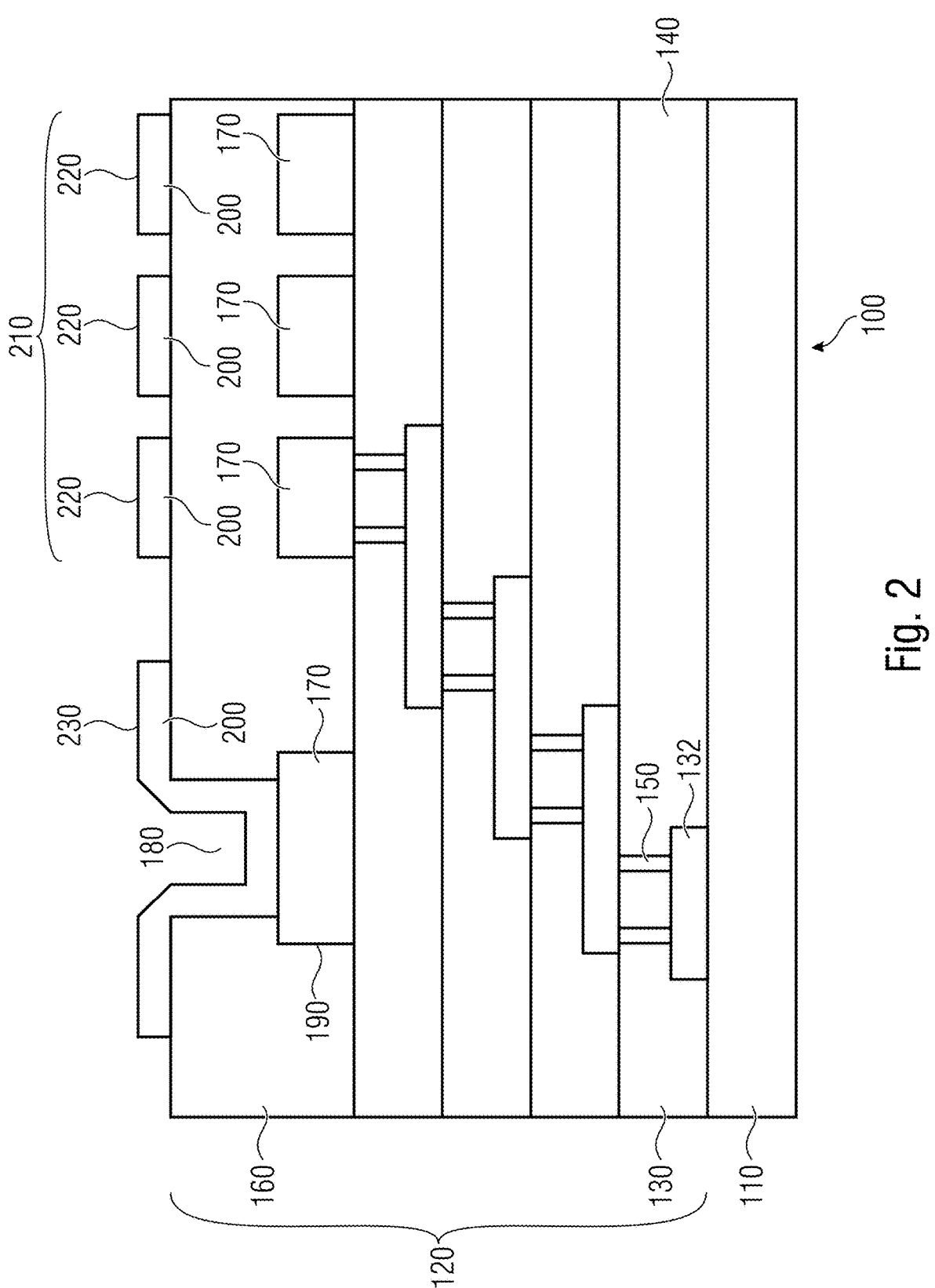
FIG. 2 shows a schematic cross section of a substrate arrangement according to embodiments of the disclosure.

FIG. 2 shows a schematic cross section of a substrate arrangement according to embodiments of the disclosure. FIG. 2 shows a substrate arrangement 100, the substrate arrangement 100 comprising a semiconductor substrate 110 and arranged on the substrate 110 a back end of line (BEOL) stack 120. The BEOL stack 120 comprises a plurality of structured wiring layers 130 and an insulating material structure 140. The structured wiring layers may, comprise, as optionally shown, contact pads 132 and conductive vias 150. The plurality of structured wiring layers are stacked and embedded in the insulating material structure (IMS) 140.

An upmost structured wiring layer 160 of the plurality of structured wiring layers comprises a plurality 170 of contact pads. The BEOL stack 120 further comprises a recess 180, e.g. being or providing a bond pad opening. The recess 180 extends to a first set 190 of contact pads of the plurality 170 of contact pads.

The substrate arrangement further comprises a conductive layer 200, having a metallic material, on the surface of the BEOL stack. The conductive layer 200 comprises a first, structured portion 210 and a second portion 230 that is arranged on the first set of contact pads 190 of the BEOL stack 120. Furthermore, the first structured portion 210 comprises a contact pad array 220.

The first set 190 of contact pads of the BEOL stack and the second portion 230 of the conductive layer 200 are configured to form recessed wire-bond pads.

The contact pad array 220 may be contacted with an additional device, for example an organic light emitting diode (OLED). The contact pad array 220 may be provided with electric signals from the upmost structured wiring layer 160. Beneath, further structured wiring layers may be used to allow for an appropriate signal routing. The recessed wire-bond pad, formed of the first set 190 of contact pads of the BEOL stack and the second portion 230 of the conductive layer 200 may be used to allow for an electric coupling of the substrate arrangement to other devices.

Figure 3:
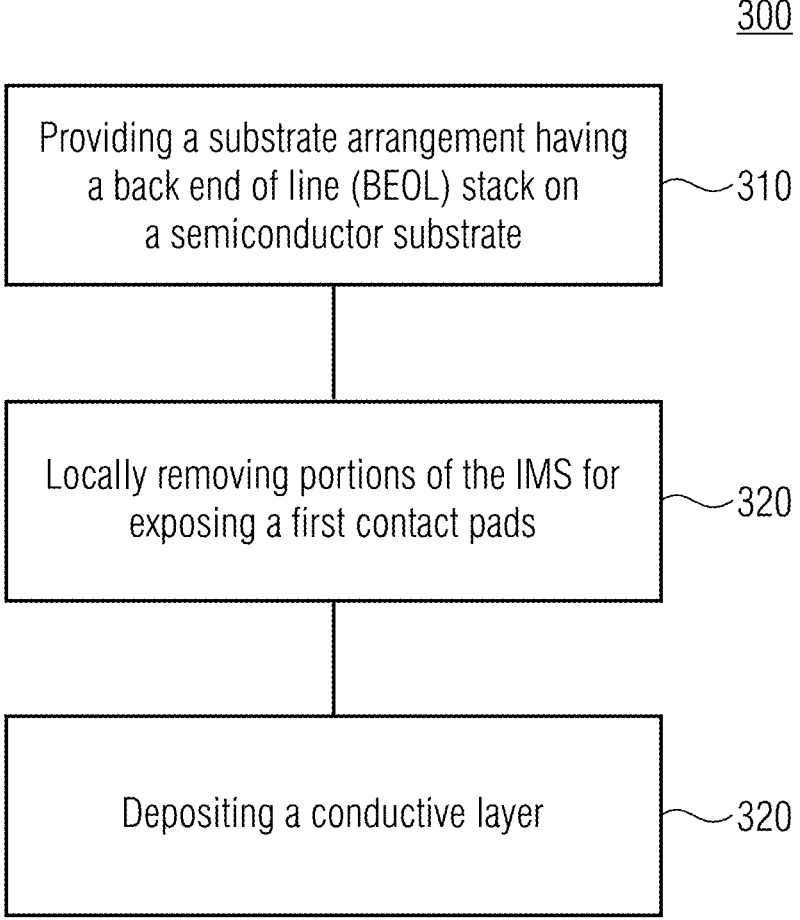
FIG. 3 shows a schematic block diagram of a manufacturing method for a micro display according to embodiments of the disclosure.

FIG. 3 shows a schematic block diagram of a manufacturing method for micro display according to embodiments of the disclosure. Method 300 comprises providing 310 a substrate arrangement having a back end of line (BEOL) stack on a semiconductor substrate, wherein the BEOL stack comprises a plurality of structured wiring layers stacked and embedded in an insulating material structure (IMS), wherein an upmost structured wiring layer of the plurality of structured wiring layers comprises a plurality of contact pads. The method 300 further comprises, after providing the substrate arrangement, locally removing 320 portions of the IMS for exposing a first set of contact pads of the plurality of contact pads of the upmost structured wiring layer. Moreover method 300 comprises, after locally removing portions of the IMS, depositing 320 a conductive layer having a metallic material, on the surface of the processed BEOL stack and structuring the deposited conductive, e.g. metallic, layer, for providing a first, structured portion of the conductive layer comprising a contact pad array and a second portion of the conductive layer that is arranged on the first set of contact pads of the BEOL stack. The first portion of the conductive layer is electrically separated from the second portion of the conductive layer and the first set of contact pads of the BEOL stack and the second portion of the conductive layer are configured to form recessed wire-bond pads.

Figures 4A, 4B:
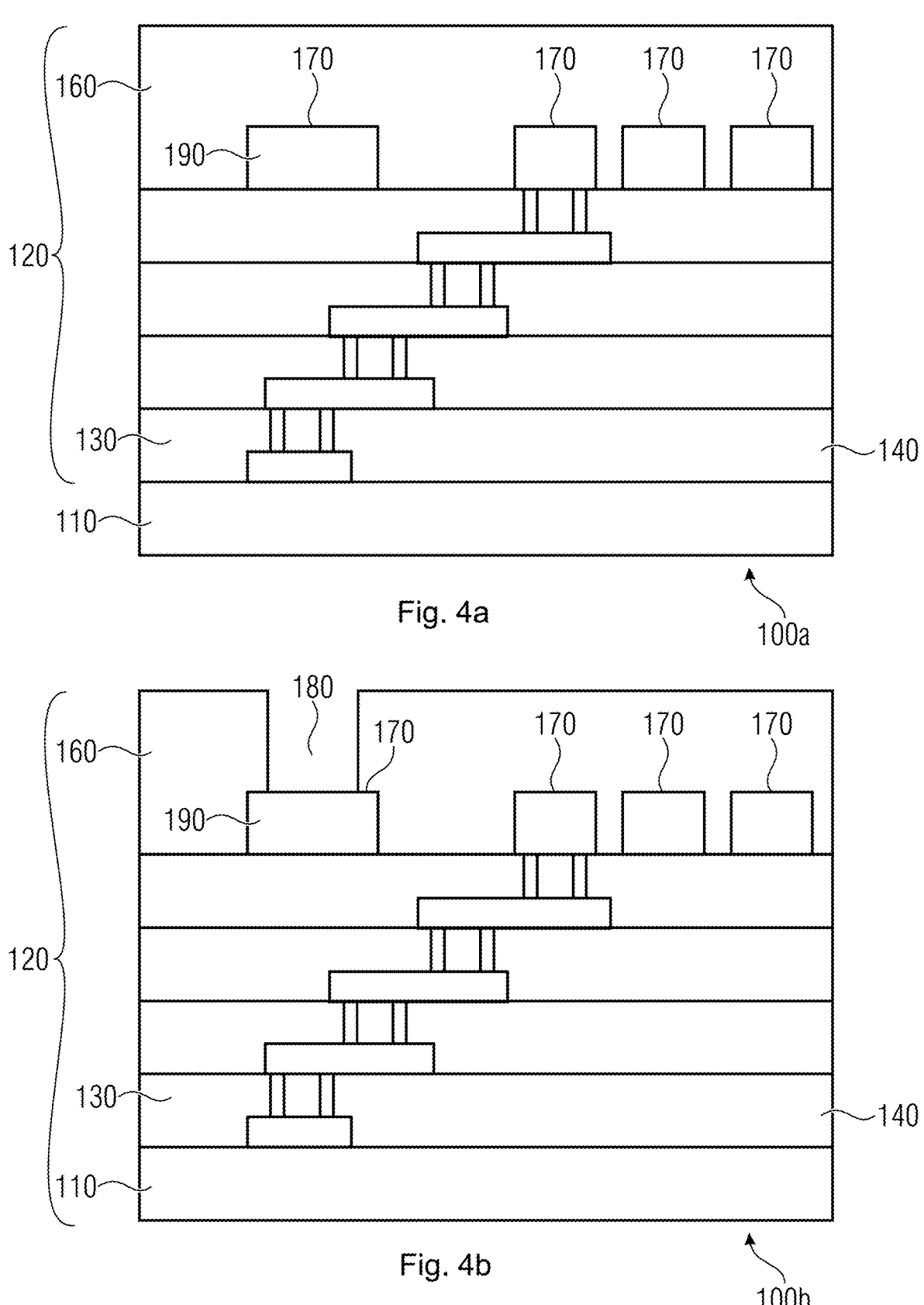
FIGS. 4a-4c show schematic cross sections of a substrate arrangement according to steps of a manufacturing method according to embodiments of the disclosure.
Figure 4C:
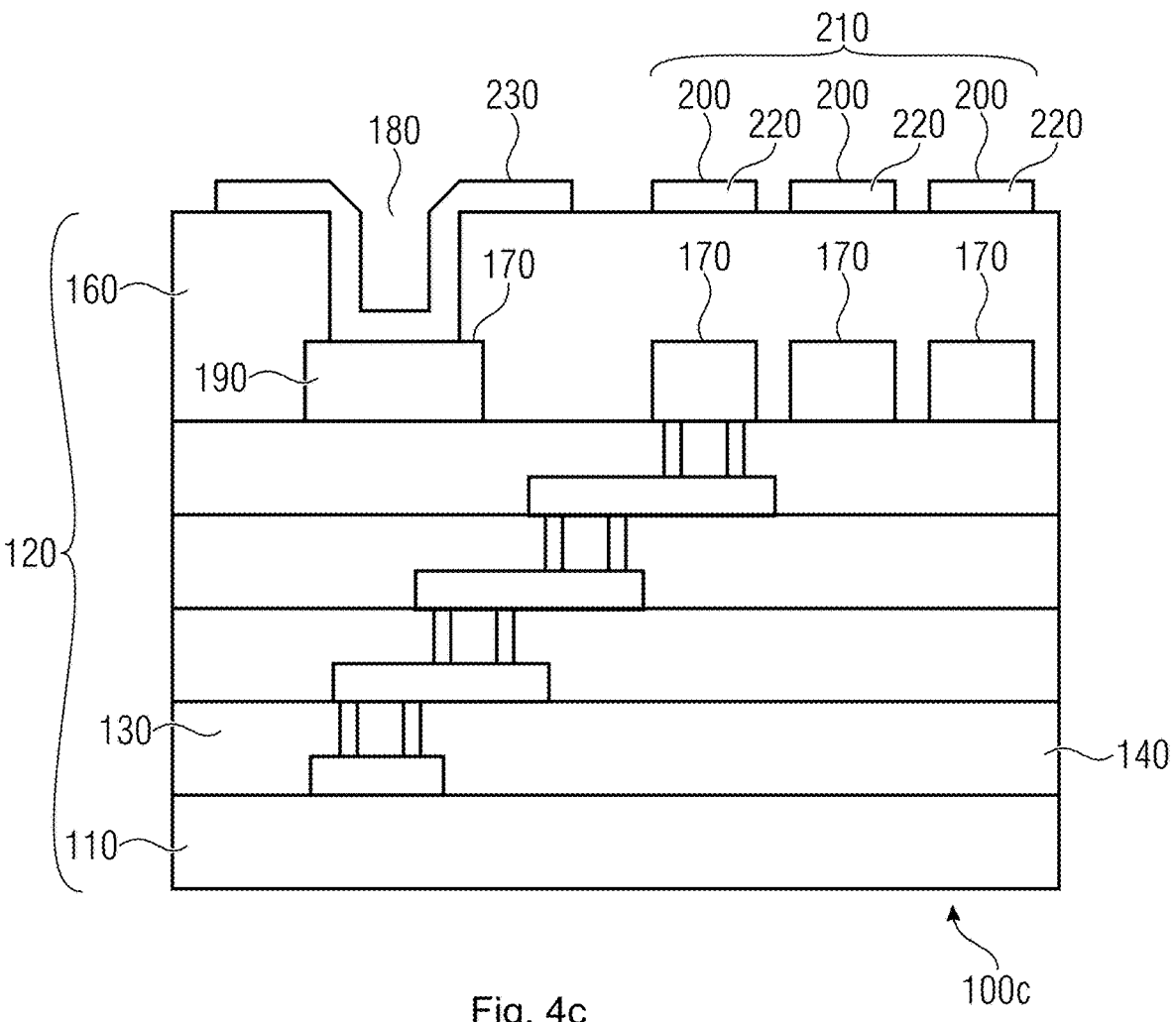

FIGS. 4a-4c show schematic cross sections of a substrate arrangement according to steps of a manufacturing method according to embodiments of the disclosure. FIGS. 4a-4c may show substrate arrangements according to the manufacturing method shown in FIG. 3.

FIGS. 4a-4c show substrate arrangement 100a, for example being provided for the manufacturing method for a micro display according to embodiments of the disclosure. The substrate arrangement 100a comprises, as explained in the context of FIG. 2. a semiconductor substrate 110, a back end of line (BEOL) stack 120 arranged on the semiconductor substrate 110, the BEOL stack comprising a plurality of structured wiring layers 130, an insulating material structure (IMS) 140, wherein an upmost structured wiring layer 160 of the plurality of structured wiring layers comprises a plurality 170 of contact pads.

After providing the substrate arrangement 100a, portions 180 of the IMS 140 may be removed locally for exposing first contact pads 190 of the plurality 170 of contact pads of the upmost structured wiring layer 160. This may provide substrate arrangement 100b.

Next, after locally removing portions 180 of the IMS 140, a conductive layer 200, having a metallic material, may be deposited, on the surface of the processed BEOL stack and the deposited conductive (metallic) layer 200 may be structured, for providing a first, structured portion 210 of the conductive layer comprising a contact pad array 220 and a second portion 230 of the conductive layer that is arranged on the first set 190 of contact pads of the BEOL stack 120. The first portion 230 of the conductive layer is electrically separated from the second portion 210 of the conductive layer and the first set of contact pads 190 of the BEOL stack 120 and the second portion 230 of the conductive layer are configured to form recessed wire-bond pads. This step may provide substrate arrangement 100c.

As shown in FIGS. 4a-4c, a manufacturing method according to embodiments of the disclosure may be of low complexity, since the deposition and structuring of the conductive layer 200 may not have to be performed with respect to certain areas.

FIGS. 5a-5h show schematic cross sections of a substrate arrangement according to a manufacturing method comprising optional steps according to embodiments of the disclosure. FIGS. 5a-5h shows substrate arrangement 100a as discussed in FIGS. 4a-4c.

Optionally, a manufacturing method according to embodiments of the disclosure, may comprise arranging conductive (e.g. metallic) vias 510, e.g. comprising tungsten or being tungsten plugs, through the IMS 140 and to a second set 520 of contact pads of the plurality 170 of contact pads of the BEOL stack 120. Furthermore, the contact pads of the contact pad array, as shown in FIG. 2 for example may be arranged on the conductive (metallic) vias. Hence, arranging the conductive vias 510 may provide substrate arrangement 100d. The conductive vias may be manufactured with low costs and may provide means to provide electrical signals to a device arranged on the top of the substrate arrangement.

Optionally, locally removing portions 180 of the IMS 410 may further comprise photolithographically forming a photoresist mask 530, or in other words, may further comprise using a lithographic process used in semiconductor manufacturing in order to form a photoresist mask 530, e.g. comprising areas 530a that may be affected by an etching medium and areas 530b that may not be affected by the etching medium, on the BEOL stack, which may provide substrate arrangement 100e, and etching the portions 180 of the IMS through the photoresist mask, and stripping the photoresist mask, which may provide substrate arrangement 100f. Such a forming of the recess may be performed with low time effort and hence low costs.

For example, as a next step, the conductive layer 200 may be deposited, which may provide substrate arrangement 100g.

Optionally, structuring the deposited conductive, e.g. metallic, layer 200 may further comprise photolithographically forming a photoresist mask on the conductive layer 200, and etching the conductive layer 200 through the photoresist mask for providing the electrically separated conductive layer portions and/or the contact pad array 220, and stripping the photoresist mask; Alternatively or in addition, structuring the deposited conductive, e.g. metallic, layer 200 may further comprise depositing a hard mask on the conductive layer 200, and photolithographically forming a photoresist mask on the hard mask, and etching, with the photoresist resist mask, the hard mask, and stripping the photoresist mask, and etching the conductive layer 200 through the hard mask for providing the electrically separated conductive layer portions and/or the contact pad array 220.

Substrate arrangements 100h and 100i show examples of an influence of such an optional step. A photoresist mask 540 may be formed photolithographically on the conductive layer 200, or for example optionally (not shown), as explained above on a hard mask. Hence the photoresist mask may comprise areas 540a that may be configured to be affected by an etching medium and areas 540b that may be configured not to be affected by the etching medium.

As a result, the deposited conductive (metallic) layer 200 may be structured, for providing the first, structured portion 210 of the conductive layer comprising a contact pad array 220 and a second portion 230 of the conductive layer that is arranged on the first set 190 of contact pads of the BEOL stack.

In general, photolithographically performed processes according to embodiments of the disclosure may, as an example, be performed as lithographic processes, or for example in other words using photolithography, e.g. with regard to depositing, exposing, developing and/or hardening photoresist masks.

Optionally, as shown in FIGS. 5a-5h, the contact pads of the contact pad 220 may be arranged on the conductive (metallic) vias 510.

As another optional feature, additional surface treatment steps may, for example, be performed at or after a step of the manufacturing method providing substrate arrangement 100i. For example, an additional plasma etch, e.g. comprising a TiO etch may be performed in order to improve surface quality of the contact pad array 220 and/or the second portion 230 of the conductive layer.

Substrate arrangement 100i may comprise gaps between contact pads of the contact pad array 220. Optionally, a manufacturing method according to embodiments may further comprise depositing a planarization material 550, e.g. cured planarization photo resist, in the gaps of the contact pad array and/or between the first portion of the conductive layer and the second portion of the conductive layer. Optionally, as shown in FIGS. 5a-5h, the planarization material 550 may be deposited as a boundary of the conductive layer 200, e.g. limiting and/or electrically insulating, the contact pad array 220 and the second portion of the conductive layer 230 laterally. As another optional feature, after depositing a planarization material 550 the manufacturing method may further comprise curing the planarization material 550, for example, in order to provide desired mechanical properties, e.g. before further processing the substrate arrangement. This may provide substrate arrangement 100*j*.

Figures 5A, 5B, 5C, 5D:
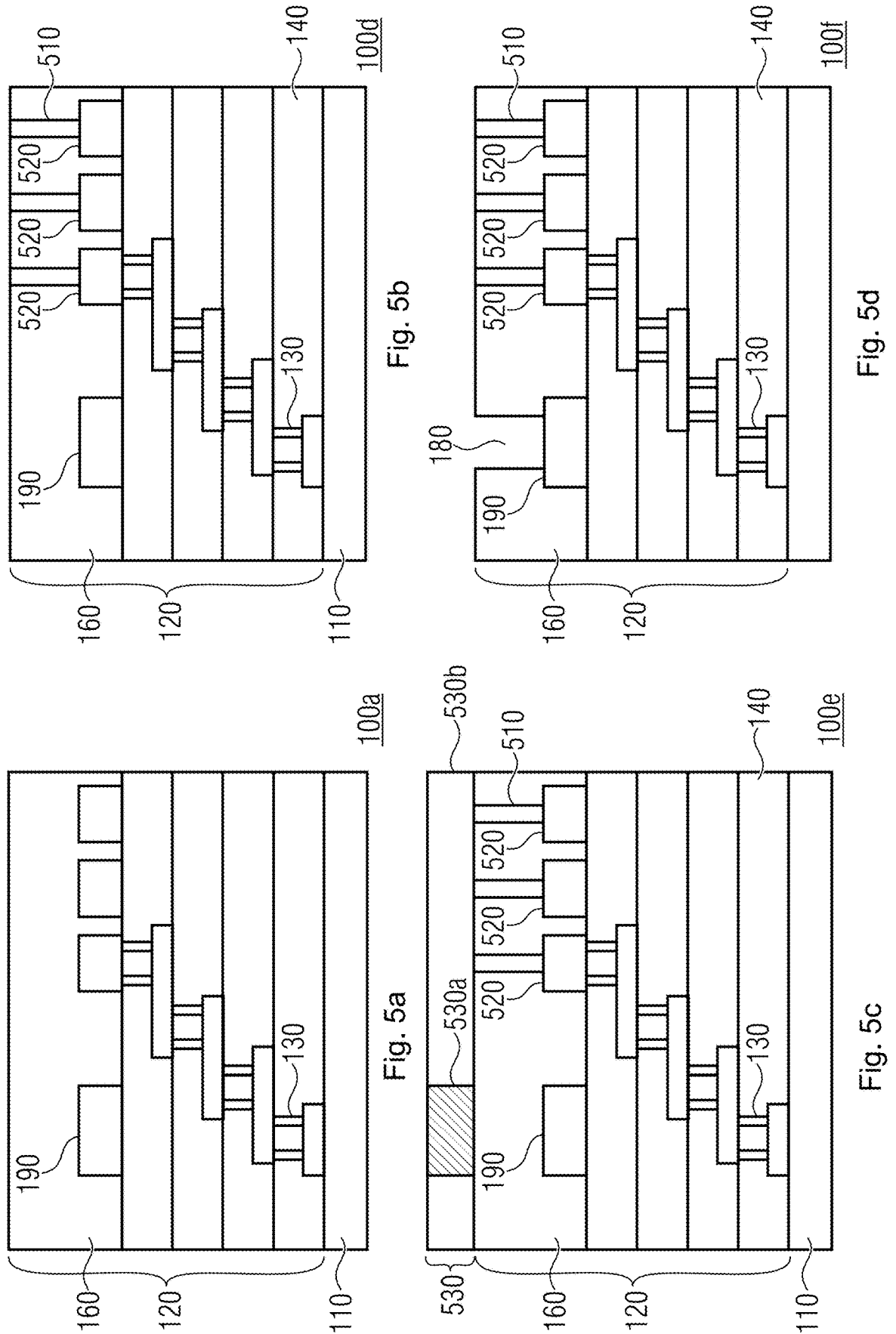
FIGS. 5a-5h show schematic cross sections of a substrate arrangement according to a manufacturing method comprising optional steps according to embodiments of the disclosure.
Figures 5E, 5F:
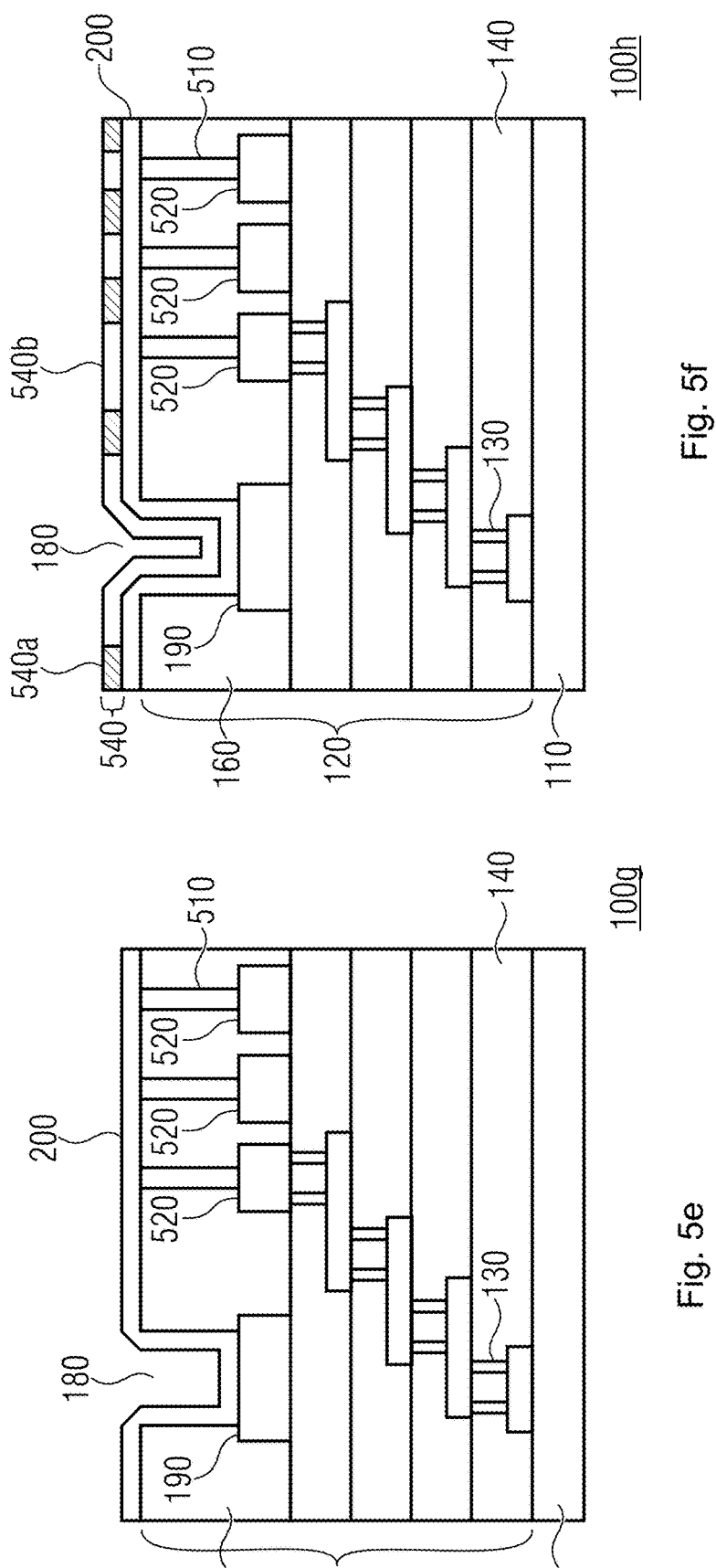
Figures 5G, 5H:
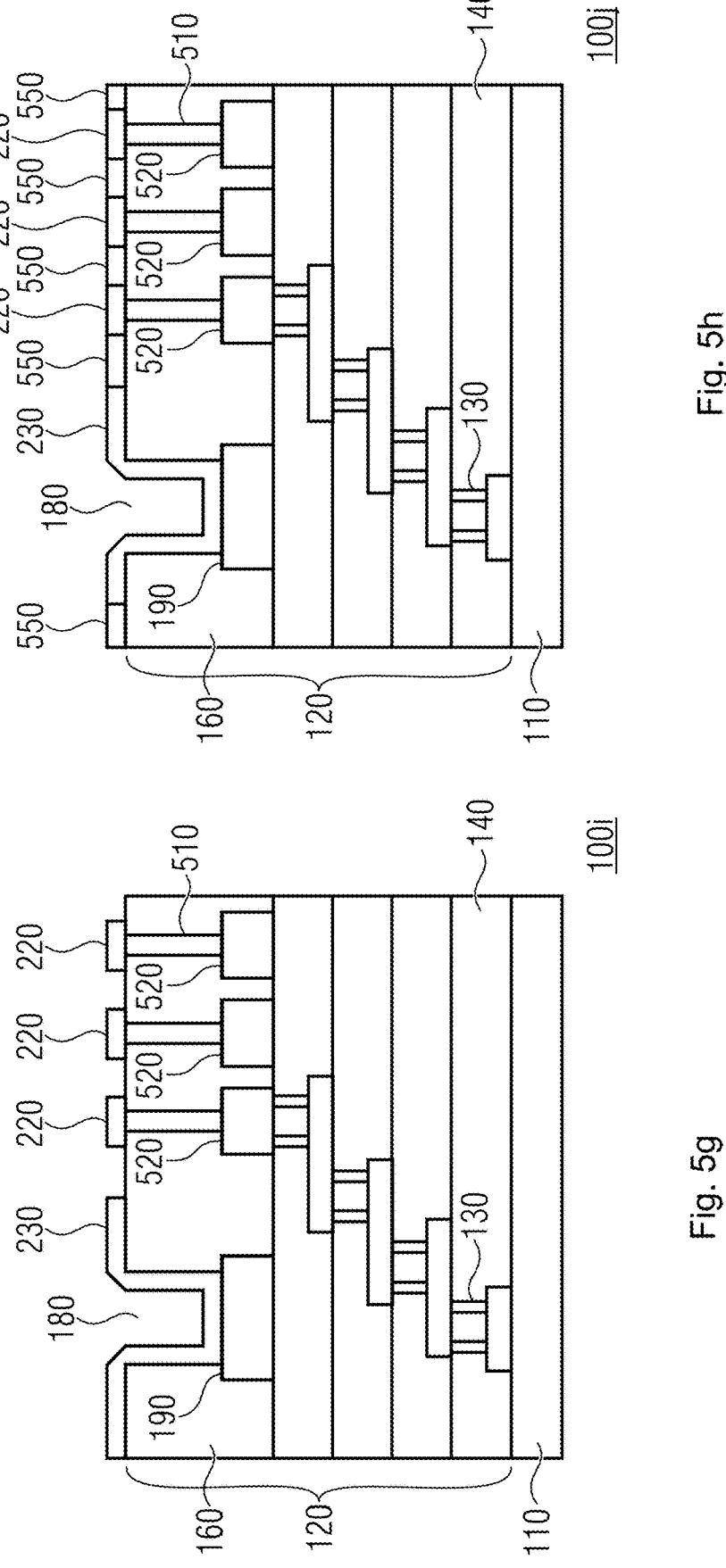
Figure 5I:
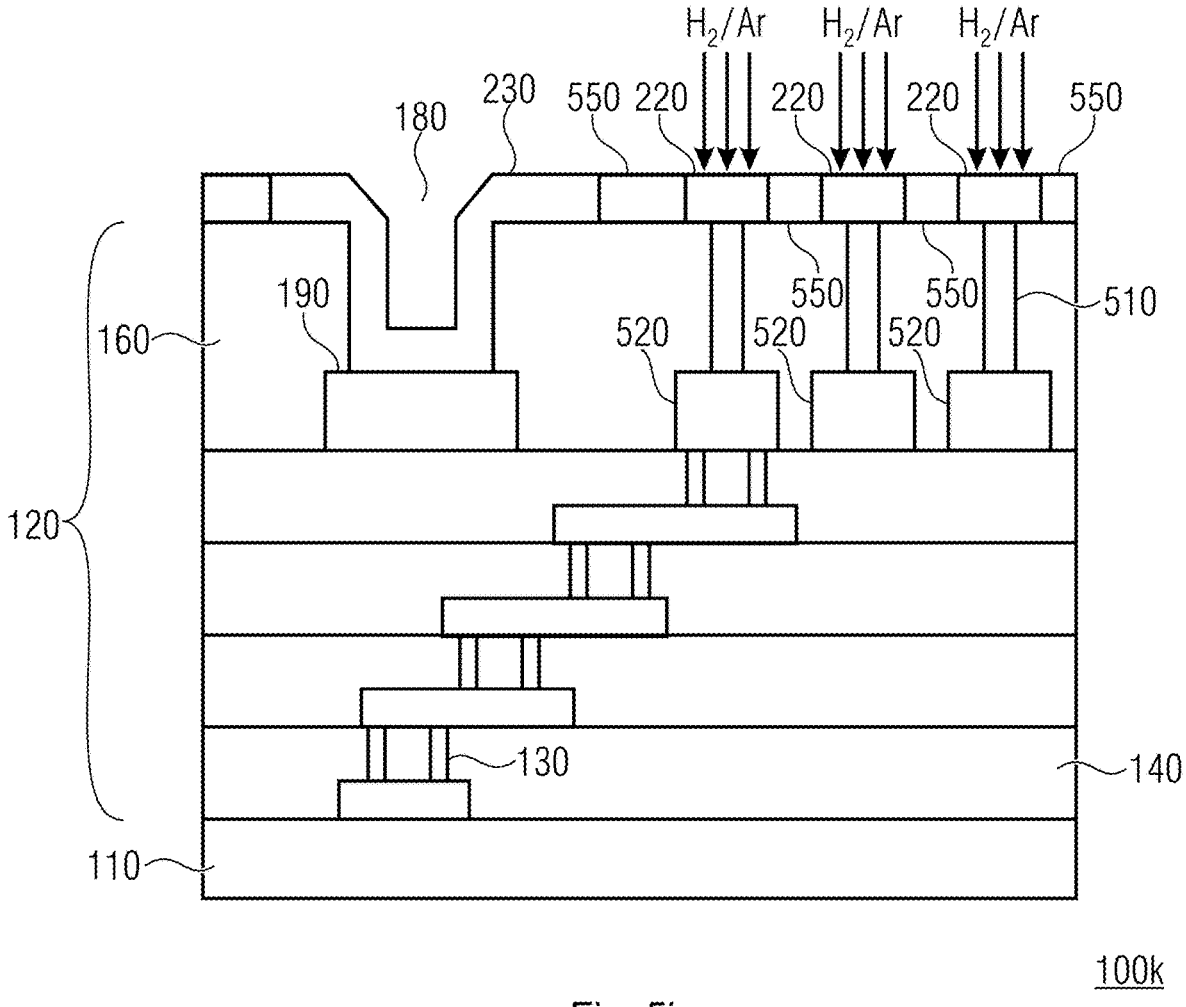
FIG. 5i shows a schematic cross section of a substrate arrangement according to a manufacturing method comprising an optional step according to embodiments of the disclosure.

FIG. 5*i* shows a schematic cross section of a substrate arrangement according to a manufacturing method comprising an optional step according to embodiments of the disclosure. As another optional feature, additional surface treatment steps may, for example, be performed at a step of the manufacturing method providing substrate arrangement 100*k* or 100*j* as shown in FIG. 5*i*. As an example, an additional plasma treatment, e.g. a final H2 and/or Ar treatment may be performed, for example, improving electrical or mechanical or bonding characteristics of the contact pad array 200 and/or and the second portion of the conductive layer 230. The treatment may be performed using H2 and/or Ar, e.g. by exploiting diffusion processes. This may provide substrate arrangement 100*k*.

Figure 6:
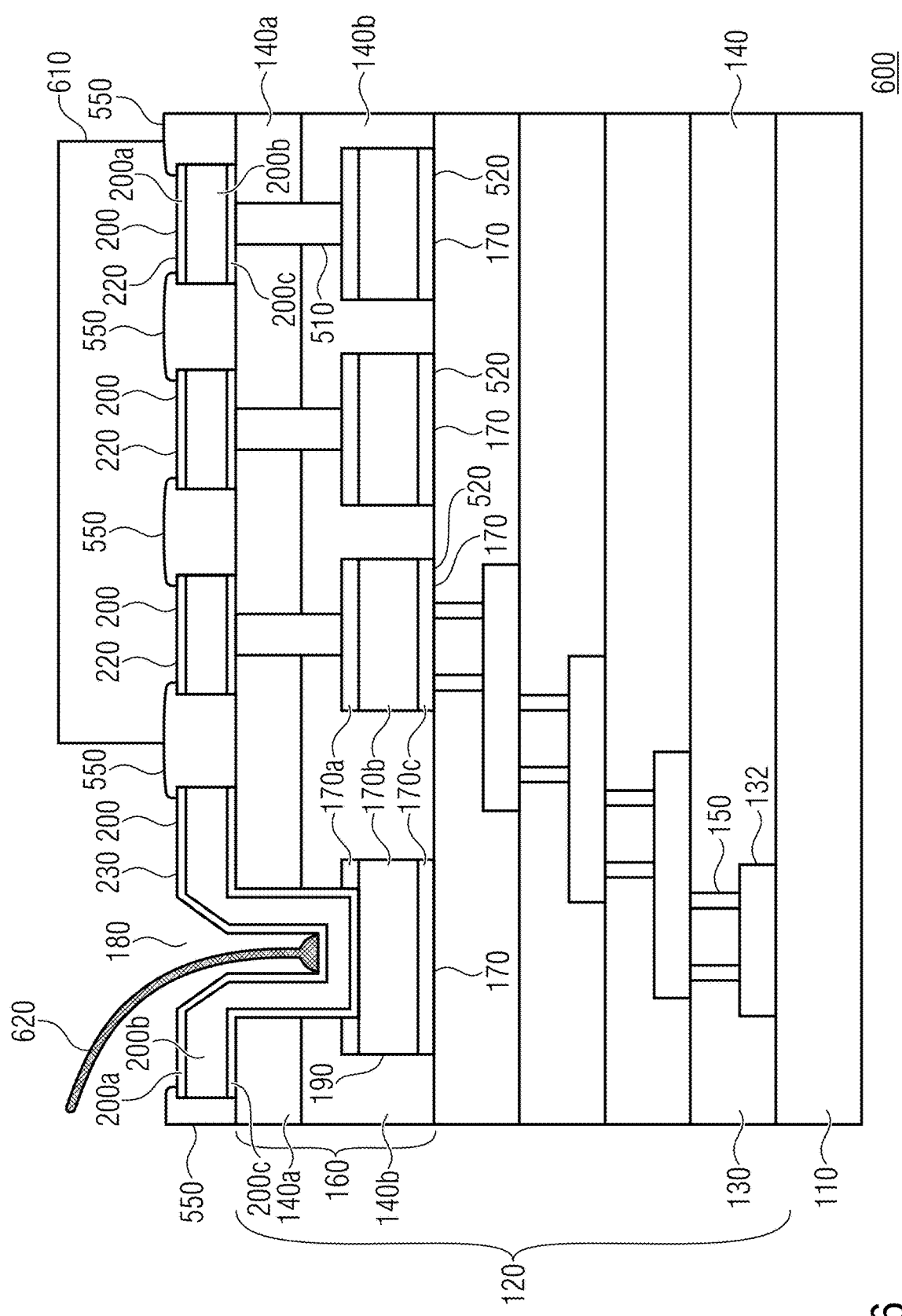
FIG. 6 shows a schematic cross section of a substrate arrangement with additional, optional features according to embodiments of the disclosure.

FIG. 6 shows a schematic cross section of a substrate arrangement according to embodiments of the disclosure with additional, optional features. FIG. 6 shows substrate arrangement 600 comprising a semiconductor substrate 110, a back end of line (BEOL) stack 120, a plurality of structured wiring layers, an insulating material structure (IMS) 140, a recess 180 in the IMS, an upmost structured wiring layer 160 of the plurality of structured wiring layers comprising a plurality 170 of contact pads, a conductive layer 200 comprising a first, structured portion comprising a contact pad array 220 and a second portion 230 that is arranged on the first set of contact pads 190 as explained before, e.g. in the context of FIG. 2.

As an optional feature, substrate arrangement 600 comprises conductive, e.g. metallic, vias 510, for example as explained in the context of FIGS. 5*a*-5*h*. In addition, the contact pad array 220 is electrically coupled with a second 520 set of contact pads of the plurality 170 of contact pads by the conductive vias 510, through the IMS 140.

As another optional feature, substrate arrangement 600 comprises a planarization material 550, wherein the planarization material 550 is an insulator, and wherein the planarization material is arranged on the surface of the BEOL stack 120, between contact pads of the contact pad array 220, and/or between the first and second portion of the conductive layer. Optionally, as shown in FIG. 6 the planarization material 550 may be deposited as a boundary of the conductive layer 200, e.g. limiting and/or electrically insulating the contact pad array 220 and the second portion of the conductive layer 230 laterally. The planarization material may be deposited with low time effort, providing a good electric decoupling of areas of the conductive layer, for example to provide electric signaling with a low amount of disturbances.

As another optional feature, the conductive layer 200 and the contact pads of the plurality 170 of contact pads comprise a plurality of sublayers, for example as shown three sublayers. Optionally, the sublayers may comprise at least one of Ti, TiN, and/or AlCu. As an example, the conductive layer comprises a first, e.g. upmost, sublayer 200*a*, a third sublayer 200*c* and a second sublayer 200*b*, e.g. in between the first and third sublayer. As an example, the first sublayer 200*a* may comprise a thickness between 1 and 20 nm. Sublayer 200*a*, e.g. a top layer of the conductive layer 200, may be a metal layer or may comprise a metal. Optionally, sublayer 200*a* may, for example, comprise Ti and/or TiN. The second sublayer 200*b*, e.g. a middle layer of the conductive layer 200, may, for example, be a metal layer or may comprise a metal. Sublayer 200*b* may comprise a thickness between 50 and 500 nm. As another optional feature, sublayer 200*b* may comprise at least one of Al, AlCu and/or AlSiCu. Sublayer 200*c*, e.g. a bottom layer, may, for example, be a metal layer as well or may comprise a metal. Sublayer 200*c* may comprise a thickness between 1 and 20 nm. As an example, sublayer 200*c* may comprise at least one of Ti or TiN. The plurality of contact pads, comprises, as an example, a first, e.g. upmost sublayers 170*a*, e.g. comprising Ti/TiN, a third sublayer 170*c*, e.g. comprising AlCu and a second sublayer 170*b*, e.g. in between the first and third sublayer, e.g. comprising Ti. Use of sublayers and the choice of materials may allow for good mechanical and/or electrical characteristics of the conductive pads. In addition, for example, the outer sublayers, e.g. sublayers 170*a*, 170*c* may be configured to allow for a good coupling and/or compatibility with neighboring materials or elements of the substrate arrangement.

As another optional feature, the insulating material comprises two layers 140*a*, 140*b*. In general, the insulating material may comprise at least one of SiN and/or SiO₂. As an example, substrate arrangement 600 comprises a first layer 140*a* comprising SiN (e.g. Silicon Nitride) and a second layer 140*b* comprising SiO₂ (e.g. Silicon Dioxide). In the example, of FIG. 6 only the upmost structured wiring layer is embedded in an insulating material comprising multiple layers and/or materials. However, this may be as well the case for any of the other structured wiring layers, according to embodiments. Hence, layers may be configured to provide a good electric insulation, e.g. layer 140*b* and good mechanical stability, e.g. layer 140*a* combining desirable material characteristics in different layers.

As another optional feature, substrate arrangement 600 comprises an organic light emitting diode (OLED) device 610 on the contact pad array 220, wherein the OLED device comprises OLED contact pads and wherein the OLED contact pads are electrically connected to the contact pad array 220. In combination with OLEDs the substrate arrangement may provide a micro display, as explained with good robustness and good quality of signalings.

Hence, a manufacturing method according to embodiments may comprise depositing an organic light emitting diode (OLED) device 610 on the contact pad array 220; and electrically connecting OLED contact pads to the contact pad array 220 and/or wire-bonding, e.g. with a wire 620, the recessed wire-bond pads. This may provide substrate arrangement 600.

The OLED device 610 may comprise an OLED arranged on the contact pad array 220 and arranged on the OLED a cathode. On the cathode a passivation layer and thereon a filter may be arranged.

As another optional feature an upmost of the sublayers of the first set 190 of contact pads may be removed. Hence, locally removing portions of the IMS may further comprise removing an upmost sublayer of the first set of contact pads. This may improve electrical coupling of the first set of contact pads 190 and the second portion 230 of the conductive layer.

Optionally, the semiconductor substrate 110 may comprise a single gate front-end-of-line (FEOL). The FEOL may comprise silicon (Si) or may, for example be processed based on a Si Wafer. The structured wiring layers may comprise contact pads 132. The structured wiring layer arranged on the semiconductor substrate 110 may optionally comprise a contact pad, comprising poly-silicon (poly-Si). As an example, the other structured wiring layers may comprise contact pads comprising AlCu, e.g. a metal material comprising aluminum and/or copper. In addition, the insulating material structure 140 may comprise an intermediate oxide (IMOX) and/or may, for example, be a dielectric layer, e.g. comprising an oxide, such as an oxide layer. The oxide of layer 140 may, for example, be a different oxide than used for the upper layers. The contact pads may be electrically coupled with each other via the conductive, e.g. metallic, vias 150. The conductive vias may be tungsten plugs.

The upmost of the structured wiring layers 160, comprising the plurality of contact pads 170, may comprise an HDP oxide, e.g. an oxide or an oxide layer, for example as IMOX, e.g. deposited via a high-density plasma process, e.g. a high-density plasma chemical vapor deposition. The oxide may, for example, be silicon oxide, e.g. silicon dioxide. Sublayer 140*b* may comprise said HDP oxide.

Sublayer 140*a* may comprise silicon nitride (SiN), and may, for example, be deposited via a plasma-enhanced chemical vapor deposition (PECVD) process.

Layer 140*a* may, for example, be a planar final passivation layer. The plurality 170 of contact pads 170 and the conductive layer 200 may, for example, comprise AlCu, e.g. a metal material comprising aluminum and/or copper.

In the following examples of dimensions of elements of substrate arrangements according to embodiments of the disclosure are discussed. However, thicknesses and/or lateral extensions or other dimensions are to be understood as approximate values in order to provide a person skilled in the art with a comprehension of the relative dimensions. Hence all values are to be understood as values with a certain tolerance e.g. +/−5%, +/−10% or for example +/−50%. In addition, a thickness may be understood as a size oriented in the direction of the stacking of the stacked structured wiring layers. A lateral dimension or size or direction may be perpendicular to such a thickness.

As another optional feature, the structuring of the conductive layer 200, for example, as explained in the context of FIGS. 5*a*-5*h* (e.g. substrate arrangement 100*h*) may comprise depositing a photoresist mask e.g. with a thickness e.g. between 800 nm and 1200 nm. The contact pads of the contact pad array 220 may, for example, comprise a lateral extension between 3.0 nm and 5 nm. Gaps in between contact pads of the contact pad array 220 may, for example, comprise a lateral extension between 0.3 μm and 1.3 μm.

As another optional feature, the first sublayer 200*a* of the conductive layer 200, as shown in FIG. 6 may comprise TiN and may optionally comprise a thickness between 4 nm and 20 nm. The second sublayer 200*b* may comprise AlCu, e.g. with a thickness between 100 nm and 300 nm and the third sublayer 200*c* may comprise Ti, e.g. with a thickness between 4 nm and 20 nm.

As another optional feature, the first sublayer 170*a* of the plurality 170 of contact pads, as shown in FIG. 6 may comprise Ti, e.g. with a thickness between 2 nm and 8 nm and/or Tin, e.g. with a thickness between 35 nm and 55 nm. The second sublayer 170*b* may comprise AlCu, e.g. with a thickness between 500 nm and 1500 nm and the third sublayer 200*c* may comprise Ti, e.g. with a thickness between 7 nm and 13 nm. Optionally, the insulating material structure (IMS) may comprise SiO₂.

As an example, the first layer 140*a* of substrate arrangement 600 of FIG. 6, comprising SiN, may comprise a thickness between 300 nm and 500 nm, the second layer 140*b*, comprising SiO₂ may comprise a thickness between 350 nm and 550 nm. Optionally, the photoresist mask 530, e.g. as shown and discussed in FIGS. 5*a*-5*h*, may comprise a thickness between 2500 nm and 4500 nm.

In the following advantages of the present disclosure are discussed in further detail. As explained before, depositing the conductive layer 200 on the first set of conductive pads

190 may allow for an effective surface treatment of the first and second portion of the conductive layer and therefore the conductive pad array 220. This may allow to avoid damages on the first set of conductive pads 190 that may occur, e.g. in case the recess 180 is formed before structuring the conductive layer, e.g. in case the conductive layer was not deposited on the first set 190 of conductive pads. In other words, because the AlCu-Pad, e.g. the first set 190 of conductive pads, is opened before electrode patterning, e.g. structuring of the conductive layer 200, many or even all final process steps may attack the AlCu-Pad surface resulting in defect topics or for example defect density topics.

Figure 7:
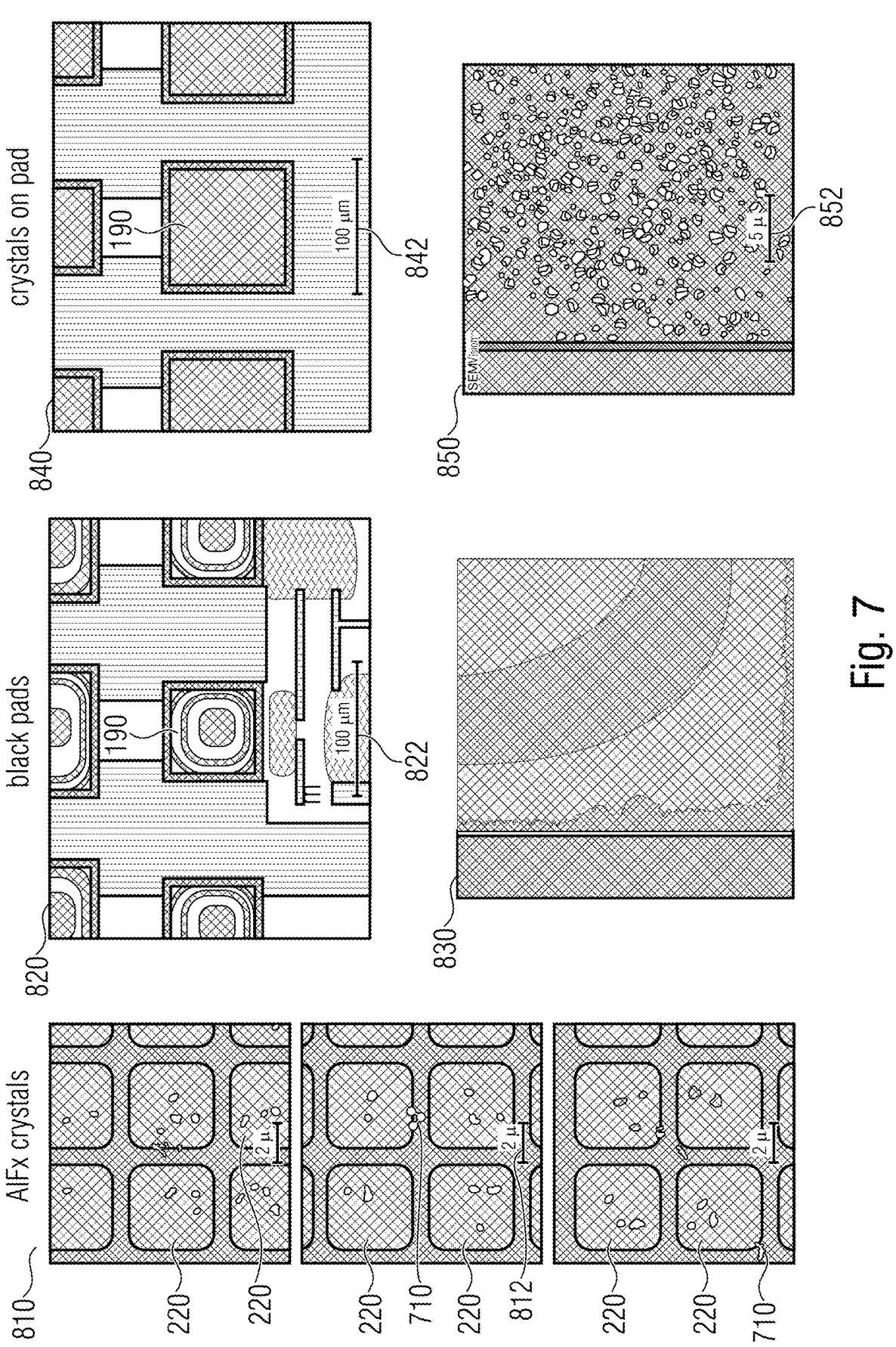
FIG. 7 shows examples of damaged surfaces of a contact pad array and of the first set of conductive pads that may be addressed with embodiments of the disclosure.

FIG. 7 shows examples of damaged surfaces of a contact pad array and of the first set of conductive pads that may be addressed with embodiments of the disclosure. FIG. 7 shows on the left three panel image 810 AlFx crystals 710 on a contact pad array 220. For example, because of a limited ability to condition the surface of the contact pad array 220, e.g. in order not to cause too much damage via the surface conditioning, on the first set of contact pads 190, defects, such as the AlFx crystals may not be removed. According to embodiments, a substrate arrangement and/or a manufacturing method thereof may allow for a good surface conditioning, e.g. comprising removing such defects, without decreasing a surface quality of the first set of contact pads. As shown with size scale 812, which may show, as an example, a distance of 2 μm, the pads of the contact pad array 220 may have an approximately rectangular or optionally quadratic form with a side length above 2 μm, e.g. between 2 μm and 6 μm. A distance between two pads of the contact pad array 220 may be below 1 μm.

Furthermore, without usage of the first set 190 of contact pads of the BEOL stack and the second portion of the conductive layer in combination as recessed wire-bond pads, manufacturing treatments, e.g, etching and/or stripping of photoresist, may cause a blackening of the surface of the first set of contact pads 190, as shown in image 820. As shown with size scale 822, which may show, as an example, a distance of 100 μm, a contact pad of the first set of contact pads 190 may have a rectangular or, for example quadratic, form for example with a side length of less than 100 μm, e.g. between 75 μm and 100 μm. Image 830 of FIG. 7 shows a zoomed in view of the black spots on the first set of conductive pads. This blackening may reduce the electric conductivity of the surface of the first set of conductive pads and may reduce the life service time of the micro display. Analogously, as shown in image 840, with scale 842, which may show, as an example, a distance of 100 μm, and in zoomed in image 850, crystals may as well form on the first set 190 of conductive pads, e.g. using alternative manufacturing methods. According to embodiments blackening of the first set of conductive pads, e.g. black pads, and crystals on the first set of conductive pads, e.g. crystals on the pad, may be averted or an influence thereof decreased, for example using, as explained before, the first set of contact pads of the BEOL stack and the second portion of the conductive layer as recessed wire-bond pads, e.g. with the second portion of the conductive layer deposited on the first set of conductive pads, therefore shielding the first set of conductive pads from undesirable surface changes and allowing for a good surface conditioning of the second portion of the conductive layer e.g. without or e.g. with a low amount of the beforementioned defects.

Furthermore, alternative substrate arrangement processes may have the principle disadvantage that the open first set 190 of contact pads sees all unwanted Al pixel processes, for example: TiO etch, Lithographically, (or for example photolithographically) applying the planarization material, (e.g. photoresist litho and cure) and/or final H2—treatment. This may result in small process windows for defect treatment (e.g. introduction of cleans). Hence, the lifetime of alternative substrate arrangement and resources for sustaining may be limited.

Embodiments according to the disclosure may allow to overcome such drawbacks, since the beforementioned process may not or may only influence in a minor way the surface of the first set of conductive pads. Hence a sophisticated defect treatment and/or introduction of cleans may be performed. In addition, a substrate arrangement according to the disclosure may enables pixels, e.g. OLED pixels, with SRAM-like data storage and, for example therefore, low or lower power consumption.

For example, in contrast to an alternative solution that may not comprise the depositing of the second portion of the conductive layer on the first set of contact pads, embodiments according to the disclosure may comprise advantages. An alternative solution may comprise the following process flow: First set of conductive pads, conductive via, e.g. OLED Electrode Via, contact pad array, e.g. OLED Electrode, forming of the recess e.g. Pad Open, planarization material, e.g. (e.g. photo) Resist (e.g. order of depositing or processing of elements shown in FIG. 8).

Regarding an alternative solution, a process sequence, e.g. a manufacturing method or a flow, may comprise an integration scheme with a separation of an etching of the contact pad array 220, e.g. the pixels or in other words the pixel etch or contact pad array Pixel etch (e.g. providing contacting for pixels of an OLED display), and of an PAD opening etch, e.g. opening of the bonding pad, or in other words the forming of the recess 180 for opening the BEOL stack 120 to the first set 190 of conductive pads, and may cause problems, e.g. as in the example of the process flow above because of the steps contact pad array, e.g. OLED Electrode and forming of the recess e.g. Pad Open. At alternative solutions, the structuring of the pad metallization, e.g. the structuring of the first set 190 of contact pads, and of the pixel metallization, e.g. the metallization of the contact pad array 220, may be performed separately. Alternative solutions may use a separate structurization for the pad metallization (First set of conductive pads plane) and for the pixel metallization (contact pad array plane). Hence, an impact of the sub-processes on the respective other metallization may cause defects on the pad surface, e.g. the surface of the first set 190 of contact pads, and on the pixel surface, e.g. the surface of the contact pad array 220.

As an example, such an alternative manufacturing sequence may require processing steps, such as TiOx removal, e.g. TiO Etch, from the contact pads of the contact pad array 220, e.g. the pixels post PAD opening etch due to a required EKC clean (e.g. polymer residue remover) for poly fence removal. For example, as shown in FIG. 7 an additional etch may create AlFx defects on the pixel surfaces, e.g. the contact pad array 220.

These problems may be overcome or addressed with embodiments of the disclosure. A flow, e.g. manufacturing method according to embodiments may shift the process of recess 180, opening pre deposition of contact pad array metal, e.g. conductive layer 200, and a structuring of contact pad array metal. Switching sequence may enable precise deposition of contact pad array metal, e.g. with top TiN layer w/o, e.g. without, further process requirements. Hence, a manufacturing method according to embodiments may comprise the following flow: A first set of conductive pads 190, OLED Electrode Via, e.g. conductive via 510, Pad Open, e.g. forming the recess 180, OLED Electrode, e.g. contact pad array 220, Resist, e.g. planarization material 550. Hence embodiments may provide an improved BEOL process flow for defect reductions.

In other words, embodiments are based on the idea or provide a technical solution for a defect free integration of a pad opening, e.g. recess 180, together with the manufacturing of an anode-electrode-array, e.g. contact pad array 220, for a pixel display.

According to embodiments, the pixel metallization, e.g. the metallization of the contact pad array 220, may be or may become part of the pad metallization, e.g. the metallization of the first set 190 of contact pads. The pixel metallization may be deposited directly, or, for example, is arranged or may be directly on the pad metallization. This may be achieved via the layout or changes in the layout, e.g. the layout of the substrate arrangement, and via the process integration or changes in the process integration, e.g. changes in the manufacturing method, in comparison to alternative solutions. Hence, e.g. via these changes, for example with regard to alternative solutions, and/or according to embodiments, at no point in time of the pad and/or pixel structurization, the metal surface of the respective other areas may be open. Hence the surface may not have to be protected in an integrated manner, and/or may not have to be treated afterwards, which may lead to defect problems, e.g. as shown in 7.

In general, embodiments according to the disclosure may comprise an identical metallization for the bond pad and the OLED-pixel-electrode. According to further embodiments the pixel metallization may be part of the pad metallization.

In general, embodiments comprise a combined pad and OLED anode manufacturing in the BEOL.

In addition, embodiments may comprise advantages over other alternative solutions, e.g. comprising a unification of pad, e.g. first set of conductive pads, and pixel in one metal layer. Embodiments may comprise improved probing and bonding characteristics, e.g. comprising a better reliability.

Figure 8:
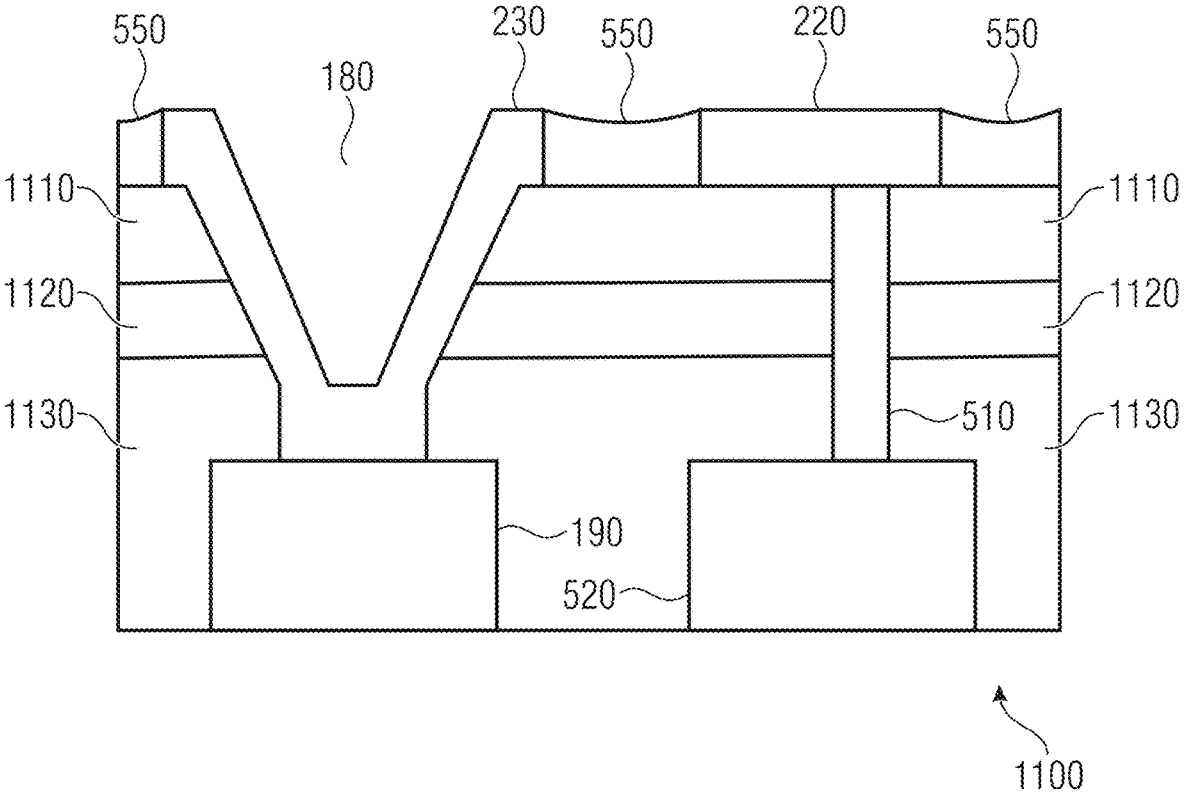
FIG. 8 shows a schematic cross section of a substrate arrangement with an optional third layer of the insulating material structure according to embodiments of the disclosure.

FIG. 8 shows a schematic cross section of a substrate arrangement with an optional third layer of the insulating material structure according to embodiments of the disclosure. Substrate arrangement 1100 comprises, in addition to the beforementioned elements, as an optional feature, an insulating material structure comprising a first layer 1110, a second layer 1120 and a third layer 1130. The first layer 1110 may comprise SiOx, e.g. with a thickness between 50 nm and 400 nm, the second layer 1120 may comprise SiN, e.g. with a thickness between 200 nm and 800 nm), and the third layer 1130 may comprise SiOx, e.g. SiOx with a thickness between 0.65 µm and 3.4 µm, e.g. with blind polish.

As another optional feature, the plurality of contact pads may comprise a plurality of sublayers, e.g. comprising TiN, e.g. with a thickness between 20 nm and 80 nm, Ti, e.g. with a thickness between 2.5 nm and 10 nm, AlCu, e.g. with a thickness between 525 nm and 2100 nm, Ti, e.g. with a thickness between 20 nm and 80 nm and Ta, e.g. with a thickness between 25 nm and 100 nm).

In general, embodiments according to the disclosure comprise substrate arrangements and manufacturing methods thereof for micro displays, e.g. with a size of 0.2", for example for graphical displays for graphical and sensor images overlay. Embodiments may allow for ultra-compact displays, for example with extreme low power, e.g. consumption, e.g. 1 mW (e.g. typically).

Furthermore, embodiments according to the disclosure may provide substrate arrangements for micro displays, e.g. with a size of 0.4", with low space requirements and low weight. Space and weight may be optimized. Furthermore, embodiments or micro displays based thereof may comprise a good trade-off between price and performance.

Moreover, embodiments according to the disclosure may provide substrate arrangements for micro displays, e.g. with a size of 0.6", with high, e.g. highest resolution and/or high, e.g. highest definition. In addition, micro displays comprising substrate arrangements according to the disclosure may comprise high brightness and/or ultra-low power, e.g. ultra-low power consumption.

Optionally, the micro display may be an AMOLED micro-display.

Moreover, embodiments according to the disclosure may provide substrate arrangements for micro displays with a luminance of 3000-15000 cd/m2, for example with mono color, color or full color.

In the following, embodiments according to the disclosure will be summarized. Said embodiments may be used alone or in combination with each other or with features and functionalities as described above.

Embodiments according to the disclosure comprise a substrate arrangement for a, for example organic light emitting diode (OLED), micro display, wherein the substrate arrangement comprises a semiconductor substrate and a back end of line (BEOL) stack, wherein the BEOL stack is arranged on the semiconductor substrate and wherein the BEOL stack comprises a plurality of structured wiring layers, an insulating material structure (IMS) and a recess in the IMS. Moreover, the plurality of structured wiring layers are stacked and embedded in the insulating material structure (IMS), and an upmost structured wiring layer of the plurality of structured wiring layers comprises a plurality of contact pads. The recess extends to a first set of contact pads of the plurality of contact pads. In addition, the substrate arrangement comprises a conductive layer, having a metallic material, on the surface of the BEOL stack, wherein the conductive layer comprises a first, structured portion comprising a contact pad array, for example for the OLED micro display, and wherein the conductive layer comprises a second portion that is arranged on the first set of contact pads of the BEOL stack. The first portion of the conductive layer is electrically separated from the second portion of the conductive layer. Furthermore, the first set of contact pads of the BEOL stack and the second portion of the conductive layer are configured to form recessed wire-bond pads.

According to further embodiments of the disclosure, the BEOL stack comprises conductive (metallic) vias, and the contact pad array is electrically coupled with a second set of contact pads of the plurality of contact pads by the conductive (metallic) vias, through the IMS.

According to further embodiments of the disclosure, the substrate arrangement comprises a planarization material, e.g. a photoresist, and the planarization material is an insulator. Furthermore, the planarization material is arranged on the surface of the BEOL stack, between contact pads of the contact pad array, and/or between the first and second portion of the conductive layer.

According to further embodiments of the disclosure, the conductive layer and/or the contact pads of the plurality of contact pads comprise a plurality of sublayers.

According to further embodiments of the disclosure, the sublayers comprise at least one of Ti, TiN, and/or AlCu.

According to further embodiments of the disclosure, the insulating material comprises at least one of SiN and/or $SiO_2$.

According to further embodiments of the disclosure, the substrate arrangement comprises an organic light emitting diode (OLED) device on the contact pad array, the OLED device comprises OLED contact pads and the OLED contact pads are electrically connected to the contact pad array.

Further embodiments according to the disclosure comprise a manufacturing method for a, for example, organic light emitting diode (OLED), micro display. The method comprises providing a substrate arrangement having a back end of line (BEOL) stack on a semiconductor substrate, wherein the BEOL stack comprises a plurality of structured wiring layers stacked and embedded in an insulating material structure (IMS). Furthermore, an upmost structured wiring layer of the plurality of structured wiring layers comprises a plurality of contact pads. The method further comprises, after providing the substrate arrangement, locally removing portions of the IMS for exposing first contact pads of the plurality of contact pads of the upmost structured wiring layer, and, after locally removing portions of the IMS, depositing a conductive layer having a metallic material, on the surface of the processed BEOL stack and structuring the deposited conductive (metallic) layer, for providing a first, structured portion of the conductive layer comprising a contact pad array and a second portion of the conductive layer that is arranged on the first set of contact pads of the BEOL stack. Moreover, the first portion of the conductive layer is electrically separated from the second portion of the conductive layer and the first set of contact pads of the BEOL stack and the second portion of the conductive layer are configured to form recessed wire-bond pads.

According to further embodiments of the disclosure, the manufacturing method further comprises arranging conductive (metallic) vias through the IMS and to a second set of contact pads of the plurality of contact pads of the BEOL stack, wherein contact pads of the contact pad array are arranged on the conductive (metallic) vias.

According to further embodiments of the disclosure, locally removing portions of the IMS further comprises photolithographically forming a photoresist mask on the BEOL stack, etching the portions of the IMS through the photoresist mask, and stripping the photoresist mask.

According to further embodiments of the disclosure, structuring the deposited conductive (metallic) layer further comprises photolithographically forming a photoresist mask on the conductive layer, etching the conductive layer through the photoresist mask for providing the electrically separated conductive layer portions and/or the contact pad array, and stripping the photoresist mask; and/or Alternatively or in addition, locally removing portions of the IMS further comprises depositing a hard mask on the conductive layer, photolithographically forming a photoresist mask on the hard mask, etching, with the photoresist resist mask, the hard mask, stripping the photoresist mask, and etching the conductive layer through the hard mask for providing the electrically separated conductive layer portions and/or the contact pad array.

According to further embodiments of the disclosure, the contact pad array comprises gaps between contact pads of the contact pad array, and wherein the manufacturing method further comprises depositing a planarization material in the gaps of the contact pad array and/or between the first portion of the conductive layer and the second portion of the conductive layer.

According to further embodiments of the disclosure, the manufacturing method further comprises depositing an organic light emitting diode (OLED) device on the contact pad array, electrically connecting OLED contact pads to the contact pad array and/or wire-bonding the recessed wire-bond pads.

According to further embodiments of the disclosure, the first set of contact pads of the plurality of contact pads comprises a plurality of sublayers and locally removing portions of the IMS further comprises removing an upmost sublayer of the first set of contact pads.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

What is claimed is:

1. A substrate arrangement comprising:
a semiconductor substrate;
a back end of line (BEOL) stack arranged on the semiconductor substrate, the BEOL stack comprising:
a plurality of structured wiring layers;
an insulating material structure (IMS);
a recess in the IMS,
wherein the plurality of structured wiring layers are stacked and embedded in the insulating material structure,
wherein an upmost structured wiring layer of the plurality of structured wiring layers comprises a plurality of contact pads,
wherein the recess extends to a first set of contact pads of the plurality of contact pads; and
a conductive layer comprising a metallic material and being arranged on a top surface of the BEOL stack,
wherein the conductive layer comprises a first, structured portion comprising a contact pad array,
wherein the conductive layer comprises a second portion that is arranged on the first set of contact pads of the BEOL stack,
wherein the first portion of the conductive layer is electrically separated from the second portion of the conductive layer, and
wherein the first set of contact pads of the BEOL stack and the second portion of the conductive layer form recessed wire-bond pads.

2. The substrate arrangement according to claim 1, wherein the BEOL stack comprises conductive vias, and wherein the contact pad array is electrically coupled with a second set of contact pads of the plurality of contact pads by the conductive vias, through the IMS.

3. The substrate arrangement according to claim 1, further comprising a planarization material, wherein the planarization material is an insulator, and wherein the planarization material is arranged on the top surface of the BEOL stack, between contact pads of the contact pad array, and/or between the first and second portions of the conductive layer.

4. The substrate arrangement according to claim 1, wherein the conductive layer and/or the plurality of contact pads comprise a plurality of sublayers.

5. The substrate arrangement according to claim 4, wherein the sublayers comprise at least one of Ti, TiN, and/or AlCu.

6. The substrate arrangement according to claim 1, wherein the insulating material structure comprises at least one of SiN and/or $SiO_2$.

7. The substrate arrangement according to claim 1, further comprising an organic light emitting diode (OLED) device on the contact pad array, wherein the OLED device comprises OLED contact pads, and wherein the OLED contact pads are electrically connected to the contact pad array.

8. A substrate arrangement comprising:
a semiconductor substrate;
a back end of line (BEOL) stack arranged on the semiconductor substrate, the BEOL stack comprising:
a plurality of structured wiring layers;
an insulating material structure (IMS);
a recess in the IMS,
wherein the plurality of structured wiring layers are stacked and embedded in the insulating material structure,
wherein an upmost structured wiring layer of the plurality of structured wiring layers comprises a plurality of contact pads,
wherein the recess extends through the IMS on a top surface of the BEOL stack to a first set of contact pads of the plurality of contact pads; and
a conductive metal layer arranged on the top surface of the BEOL stack,
wherein the conductive metal layer comprises a first, structured portion comprising a contact pad array,
wherein the conductive metal layer comprises a second portion that is arranged on the first set of contact pads of the BEOL stack,
wherein the first portion of the conductive metal layer is electrically separated from the second portion of the conductive metal layer, and
wherein the first set of contact pads of the BEOL stack and the second portion of the conductive metal layer form recessed wire-bond pads.

9. The substrate arrangement according to claim 8, wherein the conductive metal layer comprises titanium (Ti).

10. The substrate arrangement according to claim 8, wherein the conductive metal layer comprises titanium nitride (TiN).

11. The substrate arrangement according to claim 8, wherein the conductive metal layer comprises AlCu (aluminum copper alloy).

12. The substrate arrangement according to claim 8, wherein the conductive metal layer comprises AlSiCu (aluminum silicon copper alloy).

13. The substrate arrangement according to claim 8, wherein the conductive metal layer comprises a first layer being a TiNi layer, a second layer being an AlCu layer and a third layer being a Ti layer.

14. The substrate arrangement according to claim 8, wherein the insulating material structure comprises at least one of SiN and/or $SiO_2$.

15. The substrate arrangement according to claim 8, further comprising a planarization material, wherein the planarization material is an insulator, and wherein the planarization material is arranged on the top surface of the BEOL stack, between contact pads of the contact pad array, and/or between the first and second portions of the conductive metal layer.

16. The substrate arrangement according to claim 8, wherein the conductive metal layer comprises a plurality of sublayers.

17. The substrate arrangement according to claim 16, wherein the plurality of contact pads comprise a plurality of sublayers.

18. The substrate arrangement according to claim 8, further comprising an organic light emitting diode (OLED) device on the contact pad array, wherein the OLED device comprises OLED contact pads, and wherein the OLED contact pads are electrically connected to the contact pad array.

\* \* \* \* \*